United States Patent
Haar et al.

(10) Patent No.: US 7,257,788 B2
(45) Date of Patent: Aug. 14, 2007

(54) METHOD AND APPARATUS FOR CONVERTING GLOBALLY CLOCK-GATED CIRCUITS TO LOCALLY CLOCK-GATED CIRCUITS

(75) Inventors: Allen P. Haar, State College, PA (US); Joseph A. Iadanza, Hinesburg, VT (US); Sebastian T. Ventrone, South Burlington, VT (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 10/904,397

(22) Filed: Nov. 8, 2004

(65) Prior Publication Data

US 2006/0101362 A1  May 11, 2006

(51) Int. Cl.
*G06F 17/50* (2006.01)
*G06F 9/45* (2006.01)
(52) U.S. Cl. ............... 716/6; 716/12; 716/13
(58) Field of Classification Search .......... 716/6, 716/12, 13
See application file for complete search history.

(56) References Cited

U.S. PATENT DOCUMENTS

| | | | |
|---|---|---|---|
| 4,544,914 A | 10/1985 | Chan et al. | |
| 5,379,327 A | 1/1995 | Sharma et al. | |
| 5,418,930 A | 5/1995 | Swarts | |
| 5,606,564 A | 2/1997 | Ho et al. | |
| 6,088,821 A | 7/2000 | Moriguchi et al. | |
| 6,140,946 A | 10/2000 | Desrosiers et al. | |
| 6,339,338 B1 | 1/2002 | Eldridge et al. | |
| 6,445,065 B1 | 9/2002 | Gheewala et al. | |
| 6,456,103 B1 | 9/2002 | Eldridge et al. | |
| 6,550,045 B1* | 4/2003 | Lu et al. ................... | 716/6 |
| 2004/0015790 A1* | 1/2004 | Cunningham et al. ...... | 716/3 |
| 2004/0153980 A1* | 8/2004 | Wilcox et al. .............. | 716/4 |
| 2004/0153981 A1* | 8/2004 | Wilcox et al. .............. | 716/4 |
| 2005/0102643 A1* | 5/2005 | Hou et al. ................... | 716/6 |
| 2005/0198601 A1* | 9/2005 | Kuang et al. .............. | 716/6 |
| 2006/0190899 A1* | 8/2006 | Migatz et al. ............. | 716/13 |

FOREIGN PATENT DOCUMENTS

WO  WO 99/62173  12/1999

* cited by examiner

*Primary Examiner*—Jack Chiang
*Assistant Examiner*—Magid Y. Dimyan
(74) *Attorney, Agent, or Firm*—Riyan Harding; Dillon & Yudell LLP

(57) ABSTRACT

A method for converting globally clock-gated circuits to locally clock-gated circuits is disclosed. A timing analysis is initially performed on an integrated circuit (IC) design to generate a slack time report for all globally clock-gated circuits within the IC design. Based on their respective slack time indicated in the slack time report, all globally clock-gated circuits that should be connected to locally generated clocks are identified. After disconnecting from a global clock tree, each of the identified globally clock-gated circuits is subsequently connected to a locally generated clock having a clock delay comparable to its slack time indicated in the slack time report.

18 Claims, 5 Drawing Sheets

METHOD AND APPARATUS FOR CONVERTING GLOBALLY CLOCK-GATED CIRCUITS TO LOCALLY CLOCK-GATED CIRCUITS

BACKGROUND OF THE INVENTION

1. Technical Field

The present invention relates to integrated circuit design methods in general, and, in particular, to a method for assigning clock-gated circuits within an integrated circuit design. Still more particularly, the present invention relates to a method for converting globally clock-gated circuits to locally clock-gated circuits within an integrated circuit design.

2. Description of Related Art

A digital integrated circuit (IC) design typically employs many clock-gated circuits, such as flip-flops, latches, etc., that are periodically clocked by edges of a clock signal. Since there is a very large number (thousands or millions) of clock-gated circuits within an IC design, a single clock signal driver normally cannot directly supply a clock signal to all of the clock-gated circuits. Instead, a global clock tree having a set of buffers arranged in a tree-like network is utilized to supply clock signals to various clock-gated circuits. All circuits clocked by a global clock tree are considered as globally clock-gated circuits.

In order to ensure proper synchronization between various parts of a circuit design, each clock signal edge should reach all synchronization points at substantially the same time. Thus, the time required for a clock signal edge to travel from its source to any clock-gated circuit should be substantially the same for all paths it follows through the global clock tree. The time required for a clock signal edge to work its way through the global clock tree from its source to a globally clock-gated circuit depends on many factors, such as the lengths of conductors in the path, the number of buffers the edge must pass through, the switching delay of each buffer, the amount of attenuation of the clock signal incurs between buffer stages, and the load each buffer must drive. Accordingly, the global clock tree needs to be balanced by ensuring that all clock signal paths between any two tree levels are of substantially similar length and impedance, that all buffers at any level of the global clock tree drive the same number of buffers or globally clock-gated circuits at the next level of the global clock tree, and that all buffers on any given level have similar characteristics.

Generally speaking, global clock trees consume a relatively large amount of power. Global clock trees typically attribute to approximately 30-60% of the total power consumption of an IC design. In addition, the clocking of a global clock tree requires a rigid boundary between pipeline stages such that all logic must line up upon the boundaries. Thus, the ability to improve performance either in the current pipeline stage or in the next pipeline stage becomes locked to the clock boundary. The present disclosure provides a method for reducing overall clocking power consumption of an IC design such that additional flexibility in clock management can be achieved.

SUMMARY OF THE INVENTION

In accordance with a preferred embodiment of the present invention, a timing analysis is initially performed on an integrated circuit (IC) design to generate a slack time report for all globally clock-gated circuits within the IC design. Based on their respective slack time indicated in the slack time report, all globally clock-gated circuits that should be connected to locally generated clocks are identified. After disconnecting from a global clock tree, each of the identified globally clock-gated circuits is subsequently connected to a locally generated clock having a clock delay comparable to its slack time indicated in the slack time report.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
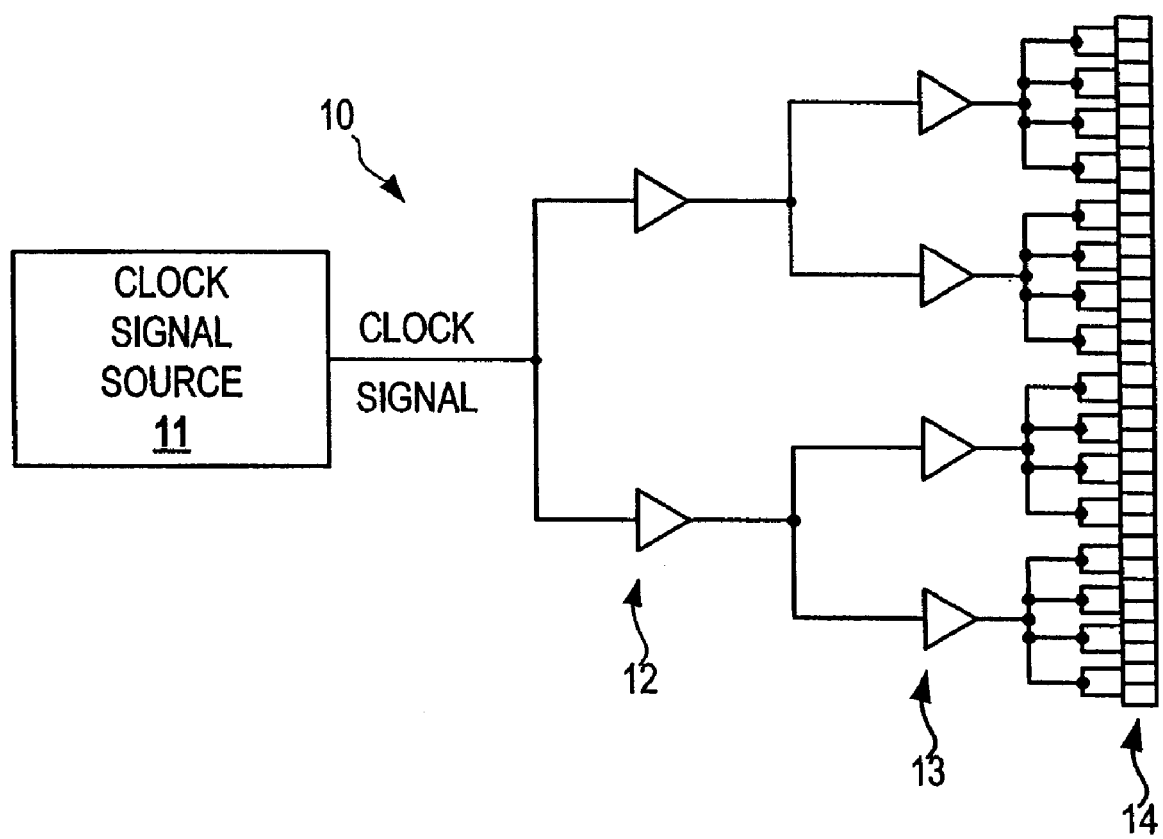
FIG. 1 is a block diagram of a conventional global clock tree for providing a common clock signal input to globally clock-gated circuits within an integrated circuit.

Referring now to the drawings and in particular to FIG. 1, there is depicted a block diagram of a conventional global clock tree for providing a common clock signal input to clock-gated circuits, such as flip-flops or latches, within an integrated circuit (IC). As shown, a global clock tree 10 includes an array of buffers 12-13 to fan out a CLOCK signal generated from a clock signal source 11. Typically, global clock tree 10 is locked tightly to a specific frequency with virtually zero jitter and clock drift across an entire IC design. In the embodiment shown in FIG. 1, two first stage buffers 12 fan the CLOCK signal out to four second stage buffers 13 that, in turn, fan the CLOCK signal out to thirty-two sinks 14. The number of buffer stages, the number of buffers per stage and the number of buffers or sinks each buffer drives are matters of design choice that depend on factors such as load capacity of buffers forming global clock tree 10, input impedance of the devices being driven, path impedances and allowable signal attenuation between stages, etc.

Many circuits in the digital portion of an IC design change their logic states very infrequently but continue to be clocked in a synchronous fashion by a high-power clock tree, such as global clock tree 10 in FIG. 1, on every clock cycle. Such practice adds to unnecessary power consumption in clock distributions and latch activities. The present invention allows some globally clock-gated circuits within an IC design that switch infrequently to be converted to locally clock-gated circuits (i.e., using a locally generated delay clock). By reducing the number of simultaneous circuits switching within an IC design on the high-power clock tree or global clock tree, power consumption and chip noise can both be reduced.

Although the localized delay clock still consumes power, an overall power reduction can be achieved if the new clock topology (i.e., one with a smaller global clock tree and the locally generated clock circuits) demands less power than the original unmodified global clock tree. Another advantage of reducing the number of globally clock-gated circuits locked to a global clock tree is that the launch noise of the set of globally clock-gated circuits driven on the global clock tree can also be reduced. Basically, the amount of simultaneous noise is reduced via a frequency spectrum spreading, which is an effect of using localized delay clocking.

Figure 2:
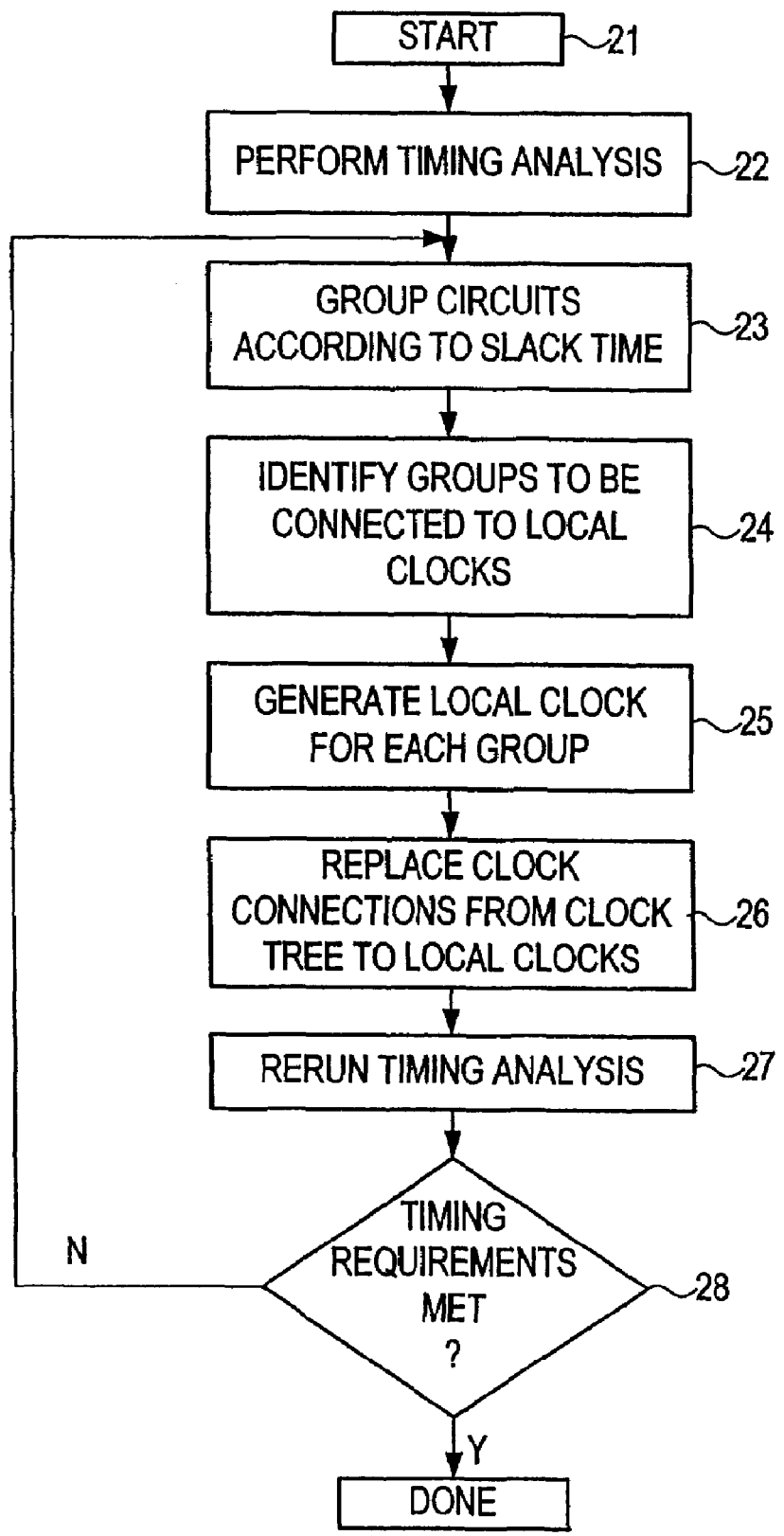
FIG. 2 is a high-level logic flow diagram of a method for converting globally clock-gated circuits to locally clock-gated circuits, in accordance with a preferred embodiment of the present invention.

With reference now to FIG. 2, there is illustrated a high-level logic flow diagram of a method for converting globally clock-gated (or synchronous) circuits to locally clock-gated circuits, in accordance with a preferred embodiment of the present invention. Starting at block 21, a synchronous IC design having multiple globally clock-gated circuits, such as latches, flip-flops, etc., is simulated using functional test vectors that are deemed to cover a wide range of normal operating conditions. If no functional test vectors are available, the synchronous IC design may be simulated using automatic test pattern generation (ATPG) vectors. In either case, a logic circuit is formed with simulation results for the IC design in question. A timing analysis is then performed on the synchronous IC design, as shown in block 22.

Based on the result of the timing analysis, each globally clock-gated circuit is categorized in a respective group according to its slack time, as depicted in block 23. For the purpose of the present invention, slack time is defined to include the amount of time margin for a globally clock-gated circuit to receive an input signal, and the amount of time margin for the globally clock-gated circuit to deliver an output signal to another circuit. Each globally clock-gated circuit can be generally placed under a positive slack time group or a negative slack time group according to the timing analysis. Globally clock-gated circuits with a positive slack time are defined as globally clock-gated circuits that are able to complete their switch operation before their allocated time under the IC design specification. Each globally clock-gated circuit in the positive slack time group is then further categorized according to a specific range of slack time under which the globally clock-gated circuit falls.

For the globally clock-gated circuits with a positive slack time, a process is performed to identify all the globally clock-gated circuits that can be connected a locally generated clock, as shown in block 24. Such process will be further explained in details in FIG. 3.

A locally generated clock is generated for each slack time range, as depicted in block 25. For example, a slack time of 1 ns to 10 ns can be divided into three ranges, with range 1 for slack time from 1 to less than 4 ns, range 2 for slack time from 4 to less than 7 ns, and range 3 for slack time from 7 to less than 10 ns (the above-mentioned slack times include both input and output timing margins). In order to accommodate the three slack time ranges, three locally generated clocks are then generated, with the first one designed for slack time range 1, the second one designed for slack time range 2 and the third one designed for slack time range 3.

Each globally clock-gated circuit that has been identified for connecting to a locally generated clock is then disconnected from a global clock tree and connected to a locally generated clock for the specific range of slack time under which the globally clock-gated circuit falls, as shown in block 26. For example, if a globally clock-gated circuit has been identified (from block 24) for connecting to a locally generated clock, and the globally clock-gated circuit has been determined (from block 22) to have a slack time of 5 ns, the globally clock-gated circuit is then disconnected from a global clock tree and connected to a locally generated clock designed for slack time from 4 to less than 7 ns. In some instances, manual adjustments to the circuit delays associated with locally generated delay clocks may be required.

After the completion of the synthesis, placement and wiring, etc., a timing analysis is performed on the entire IC design again, as shown in block 27. The performance of timing analysis is to ensure that, after the above-mentioned clock modification, the entire IC design functions as intended and the timing specification of the entire IC design is satisfied.

A determination is made as to whether or not the IC design meets the timing requirement, as shown in block 28. If the IC design does not meet the timing requirement, the process returns to block 23 for a different slack time grouping. Otherwise, if the IC design meets the timing requirement, the process is complete.

Figure 3:
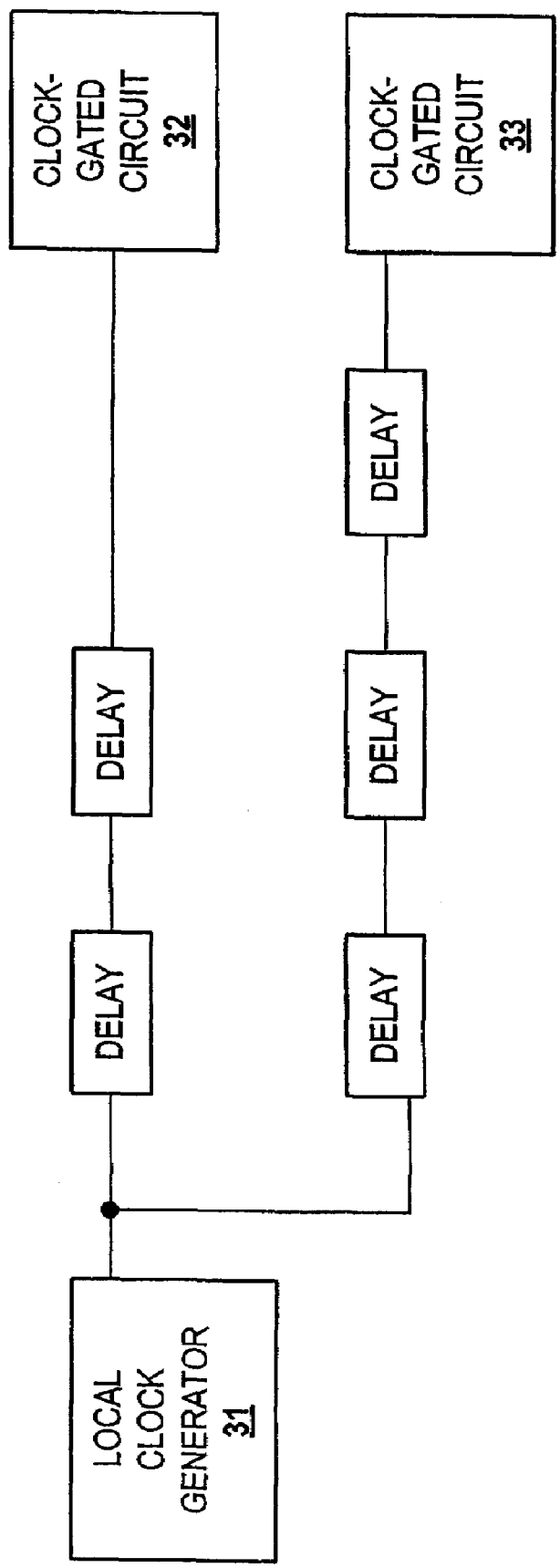
FIG. 3 is a block diagram of a locally generated clock connected to two locally clock-gated circuits, in accordance with a preferred embodiment of the present invention.

Referring now to FIG. 3, there is depicted a block diagram of a locally generated clock connected to two locally clock-gated circuits, in accordance with a preferred embodiment of the present invention. As shown, a local clock generator 31 is connected to locally clock-gated circuits 32 and 33 (both clock-gated circuits 32 and 33 were formerly globally clock-gated circuits connected to a global clock tree) via two different groups of delay elements. For example, locally clock-gated circuit 32 receives clock signals from local clock generator 31 via two delay elements, and locally clock-gated circuit 33 receives clock signals from local clock generator 31 via three delay elements.

In the generation of delayed clocks that are routed within an IC design, each delayed clock must fall within the required timing specification to guarantee the slack time for the entire process range of the technology. If the delay chain is generated in an open ended fashion where a source clock (from a local clock generator) is injected at the beginning of the delay chain and delayed clocks are tapped off from the delay chain, each stage of the delay chain is more susceptible to process, voltage, and temperature variation than the previous stage because each tapped delay is additive. To provide low jitter for each tap of the tapped delay line, the delay line may be closed with feedback in a ring fashion and a master source clock may be used as a reference comparison to the delay chain input. The master source clock and feedback input to the first stage of the delay chain can be compared to align with one another. If the two clocks do not align, tail currents can be added or subtracted equally to each stage of the delay chain until the two clocks align. Such a calibration procedure allows for multiple delay chains to be calibrated to a single master source clock and provides a solution where each delayed clock phase used on the IC design has comparable jitter.

In order to determine whether or not a globally clock-gated circuit should be converted to a locally clock-gated circuit, four inputs are preferably utilized, and they are: a logic circuit netlist, a switching factor connected to the clocked-gated circuit, a switching factor threshold, and don't touch markers.

The "switching factor" for a data input to a globally clock-gated circuit is generated by two values from the simulation results: (1) a total number of clock-signal switches present at the globally clock-gated circuit, and (2) a total number of data input switches present at the same globally clock-gated circuit. The switching factor is determined by the ratio of data input switches to clock-signal switches within the same time interval.

A user-specified "switching factor threshold" may be used to indicate which globally clock-gated circuits should be converted to corresponding locally clock-gated circuits. Specifically, clock-gated circuits whose data-input switching factors exceed the switching factor threshold are targeted for conversion. The switching factor threshold may be selected by a user to be any value between 0 and 1 although, for example, it may not be recommended to use a switching factor greater than 0.5.

A circuit designer may desire to override the conversion process for any globally clock-gated circuit within an IC design. A don't touch marker can be applied to any globally clock-gated circuit within an IC design that is intended to remain connected to a global clock tree (instead of being connected to a localized delay clock).

Figure 4:
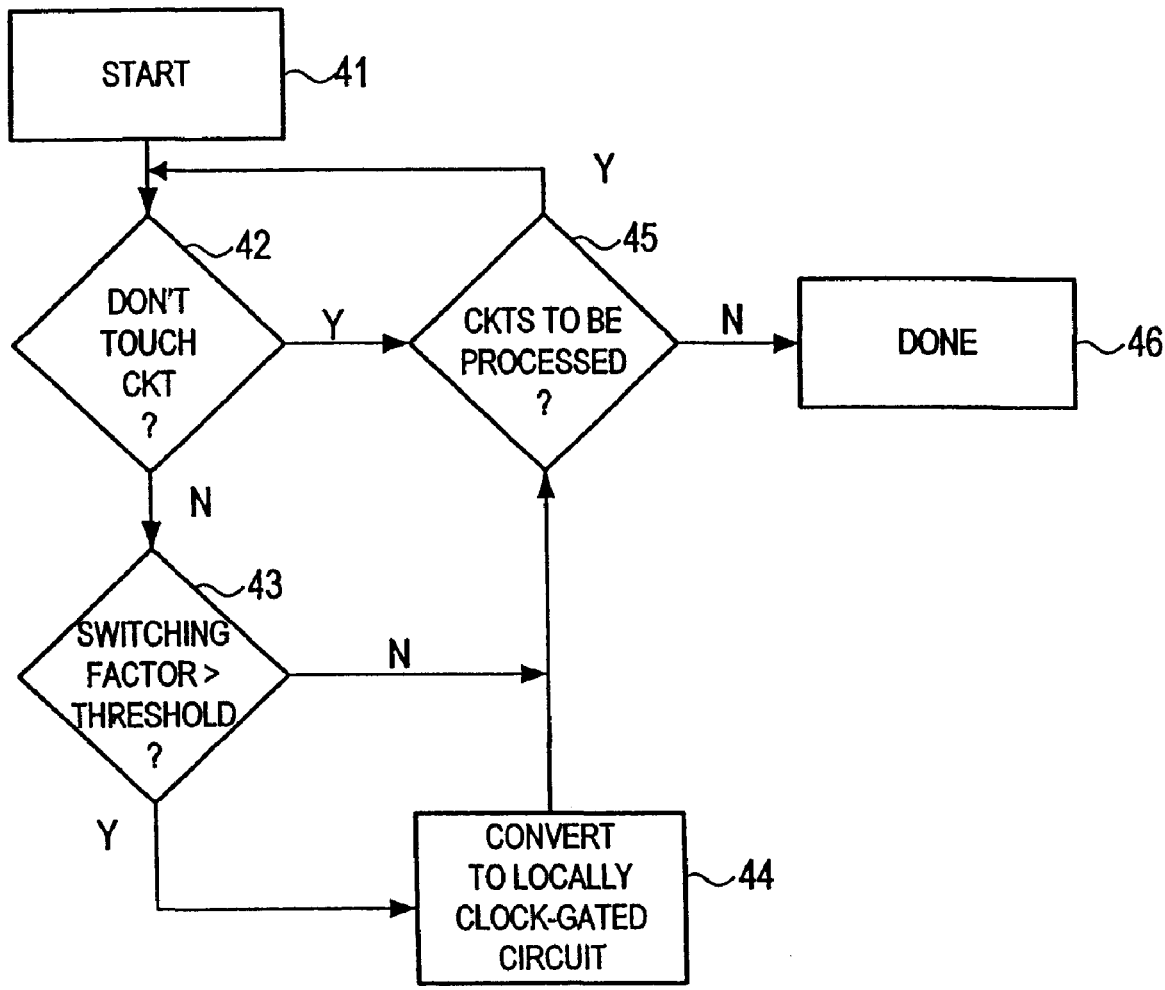
FIG. 4 is a high-level logic flow diagram of a method for determining whether or not a globally clock-gated circuit should be converted to a locally clock-gated circuit, in accordance with a preferred embodiment of the present invention.

With reference now to FIG. 4, there is illustrated a high-level logic flow diagram of a method for determining whether or not a globally clock-gated circuit should be converted to a locally clock-gated circuit, in accordance with a preferred embodiment of the present invention. Starting at block 41, a determination is made as to whether or not a globally clock-gated circuit is a "don't touch" circuit (i.e., whether or not a "don't touch" marker has been applied), as shown in block 42. If the globally clock-gated circuit is not a "don't touch" circuit, then a determination is made as to whether or not a switching factor of the globally clock-gated circuit is greater than a predetermined switching factor threshold, as shown in block 43. Each globally clock-gated circuit in the IC design is considered by the process of "don't touch." Any globally clock-gated circuit marked "don't touch" is left unchanged. If, however, the globally clock-gated circuit is a circuit, then the method proceeds to block 45.

If the switching factor of the globally clock-gated circuit is greater than the predetermined switching factor threshold, then the globally clock-gated circuit is converted to a corresponding locally clock-gated circuit, as shown in block 44. The globally clock-gated circuit can be converted to a corresponding locally clock-gated circuit by disconnecting the globally clock-gated circuit from a global clock tree and connecting the globally clock-gated circuit to a locally generated delay clock. Otherwise, if the switching factor of the globally clock-gated circuit is not greater than the predetermined switching factor threshold, the process proceeds to block 45. If, however, the switching factor of the globally clock-gated circuit is less than or equal to the predetermined switching factor threshold, then the method proceeds to block 45.

As depicted in block 45, a determination is made as to whether or not there is any other globally clock-gated circuit left to be processed. If there is a globally clock-gated circuit left to be processed, the process returns to block 42. Otherwise, if there is no globally clock-gated circuit left to be processed, the process is completed, as shown in block 46.

As has been described, the present invention provides a method and apparatus for converting globally clock-gated circuits to locally clock-gated circuits. In essence, all globally clock-gated circuits with a switching factor greater than a switching factor threshold are converted to corresponding locally clock-gated circuits, and globally clock-gated circuits with a switching factor less than (equal to) the switching factor threshold are left unchanged. Once all the globally clock-gated circuits that were targeted for conversion have been converted, simulation is again performed on the entire IC design, with a focus on the locally clock-gated circuit cuts.

By allowing the set of clocks to be generated based upon actual layout and timing reports, the noise spectrum can be spread in such a way as to minimize the overall effect on more timing critical paths, and to reduce signal coupling noise and power supply noise due to simultaneous switching. In addition, by maximizing the number of local clocks versus the total number of global synchronously generated clocks, the overall power consumption can be reduced.

Figure 5:
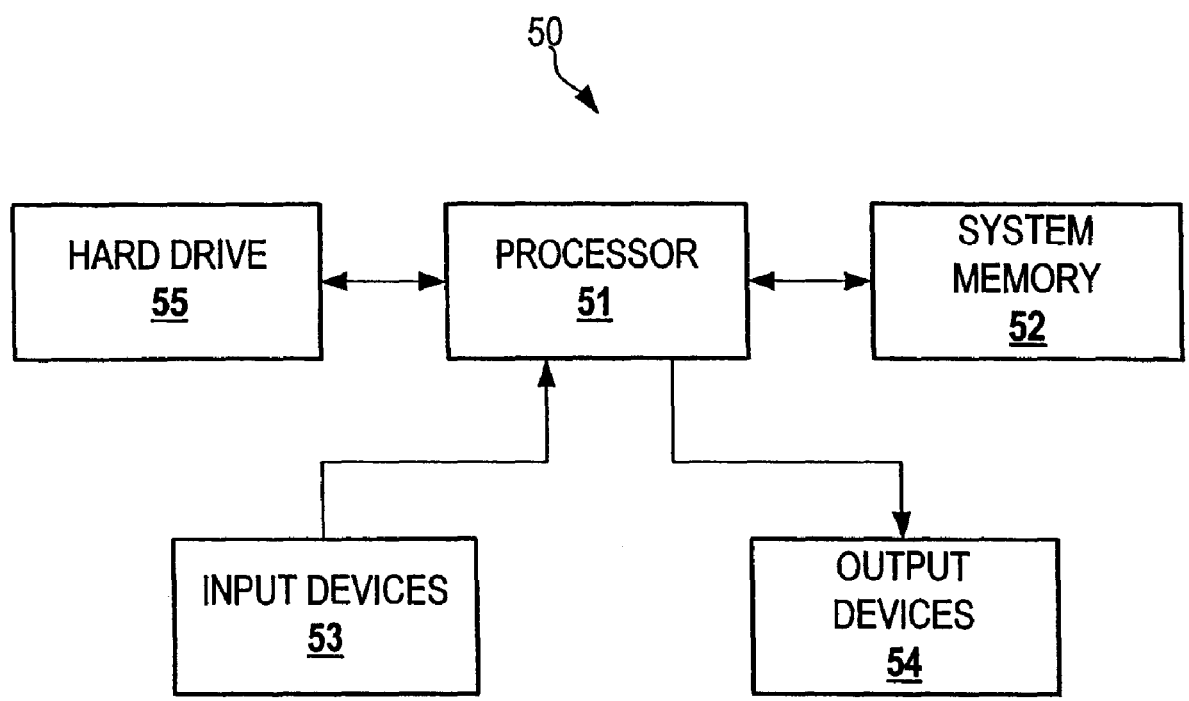
FIG. 5 is a block diagram of a computer system in which a preferred embodiment of the present invention is incorporated.

Referring now to FIG. 5, there is depicted a block diagram of a computer system in which a preferred embodiment of the present invention is incorporated. As shown, a computer system 50 includes a processor 51, a system memory 52 and a hard drive 55. Processor 51 executes instructions and data that are stored in system memory 52. In addition, computer system 50 also includes input devices 53, such as a keyboard and a mouse, output devices 54, such as a display monitor and a printer.

Although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for converting globally clock-gated circuits to locally clock-gated circuits, said method comprising:

performing a timing analysis on an integrated circuit (IC) design to generate a slack time report for globally clock-gated circuits within said IC design; determining whether or not a globally clock-gated circuit is a don't touch circuit, and if not determining, by utilizing a logic circuit netlist, a switching factor and a switching factor threshold, whether or not the globally clock-gated circuit should be converted to a locally clock-gated circuit:

identifying one of said globally clock-gated circuits to be connected to a locally generated clock according to its slack time indicated in said slack time report; and disconnecting said identified globally clock-gated circuit from a global clock tree and connecting said identified globally clock-gated circuit to a locally generated clock having a clock delay comparable to its slack time indicated in said slack time report.

2. The method of claim 1, wherein said method further includes assigning one of said globally clock-gated circuits to a group according to its slack time in said slack time report.

3. The method of claim 1, wherein said method further includes providing said locally generated clock having a clock delay comparable to a slack time indicated in said slack time report.

4. The method of claim 1, wherein said method further includes performing said timing analysis again on said IC design after said identified globally clock-gated circuit has been connected to said locally generated clock.

5. The method of claim 1, wherein said switching factor is generated by a total number of clock switches present at said globally clock-gated circuit and a total number of data input switches for said globally clock-gated circuit.

6. The method of claim 1, wherein said switching factor threshold indicates a level of switching activity a user desires to convert globally clock-gated circuits to corresponding locally clock-gated circuits.

7. A computer program product residing on a computer usable medium for converting globally clock-gated circuits to locally clock-gated circuits, said computer program product comprising:

program code means for performing a timing analysis on an integrated circuit (IC) design to generate a slack time report for globally clock-gated circuits within said IC design; program code means for determining whether or not a globally clock-gated circuit is a don't touch circuit;

program code means for determining, by utilizing a logic circuit netlist, a switching factor and a switching factor threshold, whether or not the globally clock-gated circuit should be converted to a locally clock-gated circuit;

program code means for identifying one of said globally clock-gated circuits to be connected to a locally generated clock according to its slack time indicated in said slack time report; and program code means for disconnecting said identified globally clock-gated circuit from a global clock tree and connecting said identified globally clock-gated circuit to a locally generated clock having a clock delay comparable to its slack time indicated in said slack time report.

8. The computer program product of claim 7, wherein said computer program product further includes program code means for assigning one of said globally clock-gated circuits to a group according to its slack time in said slack time report.

9. The computer program product of claim 7, wherein said computer program product further includes program code means for providing said locally generated clock having a clock delay comparable to a slack time indicated in said slack time report.

10. The computer program product of claim 7, wherein said computer program product further includes program code means for performing said timing analysis again on said IC design after said identified globally clock-gated circuit has been connected to said locally generated clock.

11. The computer program product of claim 7 wherein said switching factor is generated by a total number of clock switches present at said globally clock-gated circuit and a total number of data input switches for said globally clock-gated circuit.

12. The computer program product of claim 7 wherein said switching factor threshold indicates a level of switching activity a user desires to convert globally clock-gated circuits to corresponding locally clock-gated circuits.

13. A computer system capable of converting globally clock-gated circuits to locally clock-gated circuits, said computer system comprising:

means for performing a timing analysis on an integrated circuit (IC) design to generate a slack time report for globally clock-gated circuits within said IC design;

means for determining whether or not a globally clock-gated circuit is a don't touch circuit;

means for determining, by utilizing a logic circuit netlist, a switching factor and a switching factor threshold, whether or not the globally clock-gated circuit should be converted to a locally clock-gated circuit;

means for identifying one of said globally clock-gated circuits to be connected to a locally generated clock according to its slack time indicated in said slack time report; and means for disconnecting said identified globally clock-gated circuit from a global clock tree and connecting said identified globally clock-gated circuit to a locally generated clock having a clock delay comparable to its slack time indicated in said slack time report.

14. The computer system of claim 13, wherein said computer system further includes means for assigning one of said globally clock-gated circuits to a group according to its slack time in said slack time report.

15. The computer system of claim 13, wherein said computer system further includes means for providing said locally generated clock having a clock delay comparable to a slack time indicated in said slack time report.

16. The computer system of claim 13, wherein said computer system further includes means for performing said timing analysis again on said IC design after said identified globally clock-gated circuit has been connected to said locally generated clock.

17. The computer system of claim 13 wherein said switching factor is generated by a total number of clock switches present at said globally clock-gated circuit and a total number of data input switches for said globally clock-gated circuit.

18. The computer system of claim 17 wherein said switching factor threshold indicates a level of switching activity a user desires to convert globally clock-gated circuits to corresponding locally clock-gated circuits.

* * * * *